(12) United States Patent
Mikhemar et al.

(10) Patent No.: US 9,160,388 B2
(45) Date of Patent: Oct. 13, 2015

(54) RECEIVER ARCHITECTURE WITH COMPLEMENTARY PASSIVE MIXER AND COMPLEMENTARY COMMON-GATE TIA WITH LOW-NOISE GAIN CONTROL

(71) Applicant: BROADCOM CORPORATION, Irvine, CA (US)

(72) Inventors: Mohyee Mikhemar, Aliso Viejo, CA (US); Hooman Darabi, Laguna Niguel, CA (US)

(73) Assignee: BROADCOM CORPORATION, Irvine, CA (US)

( * ) Notice: Subject to any disclaimer, the term of this patent is extended or adjusted under 35 U.S.C. 154(b) by 413 days.

(21) Appl. No.: 13/719,076

(22) Filed: Dec. 18, 2012

(65) Prior Publication Data

US 2014/0171003 A1    Jun. 19, 2014

(51) Int. Cl.
| | |
|---|---|
| H04B 1/06 | (2006.01) |
| H04B 1/16 | (2006.01) |
| H03D 7/14 | (2006.01) |
| H03F 1/08 | (2006.01) |
| H03F 3/45 | (2006.01) |
| H04B 1/00 | (2006.01) |

(52) U.S. Cl.
CPC .............. *H04B 1/16* (2013.01); *H03D 7/1441* (2013.01); *H03D 7/1466* (2013.01); *H03F 1/086* (2013.01); *H03F 3/45179* (2013.01); *H03F 2203/45306* (2013.01); *H04B 1/0003* (2013.01); *Y10T 29/49117* (2015.01)

(58) Field of Classification Search
USPC ....................................... 455/232.1
See application file for complete search history.

(56) References Cited

U.S. PATENT DOCUMENTS

| | | | | |
|---|---|---|---|---|
| 7,865,164 | B2 * | 1/2011 | Xu et al. | 455/323 |
| 2013/0069727 | A1 * | 3/2013 | Lin | 330/296 |

* cited by examiner

*Primary Examiner* — Ajibola Akinyemi
(74) *Attorney, Agent, or Firm* — McDermott Will & Emery LLP

(57) ABSTRACT

A circuit for a low-power and blocker-tolerant mixer-amplifier stage may include a complementary mixer formed by transmission gates having complementary structures. The complementary mixer may be configured to receive one or more radio-frequency (RF) signals and to convert the one or more RF signals to intermediate frequency (IF) current signals. A complementary TIA may be coupled to the complementary mixer and may be configured to receive the IF current signals and provide IF voltage signals. The complementary TIA may be formed by coupling an NMOS-TIA and a PMOS-TIA to a common load. A first portion of the complementary mixer may be coupled to the NMOS-TIA and a second portion of the complementary mixer may be coupled to the PMOS-TIA.

20 Claims, 4 Drawing Sheets

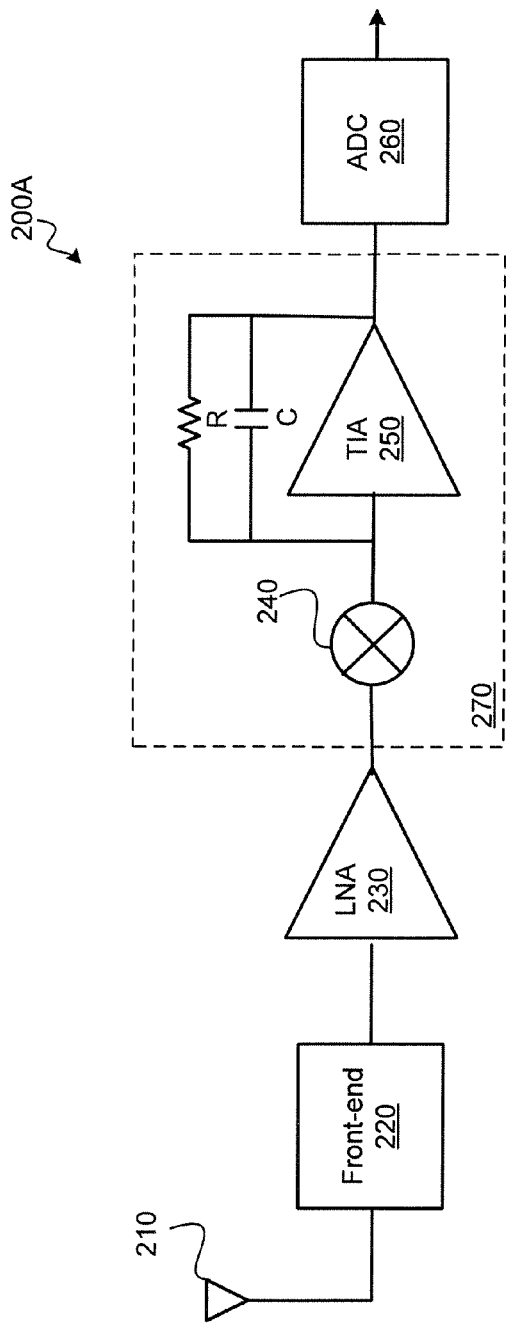
FIG. 2A
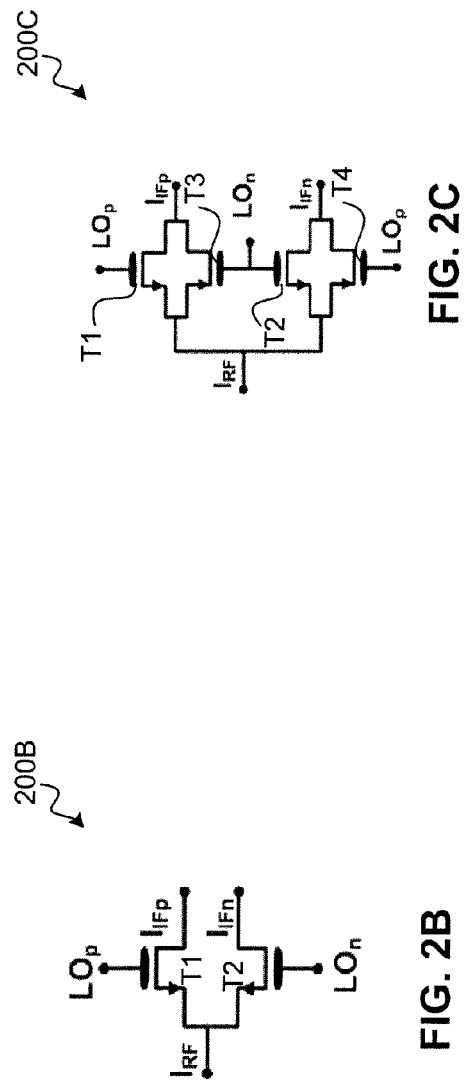
FIG. 2C
FIG. 2B

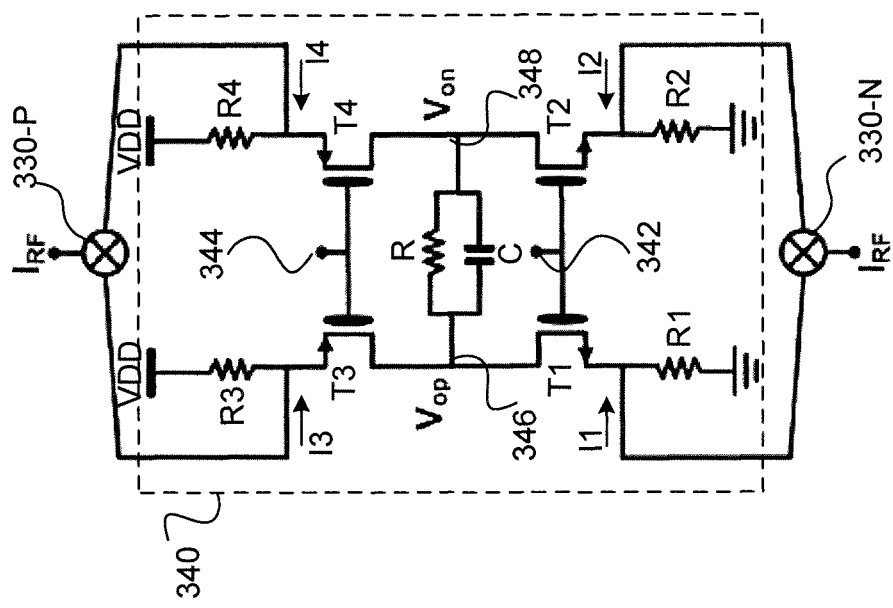
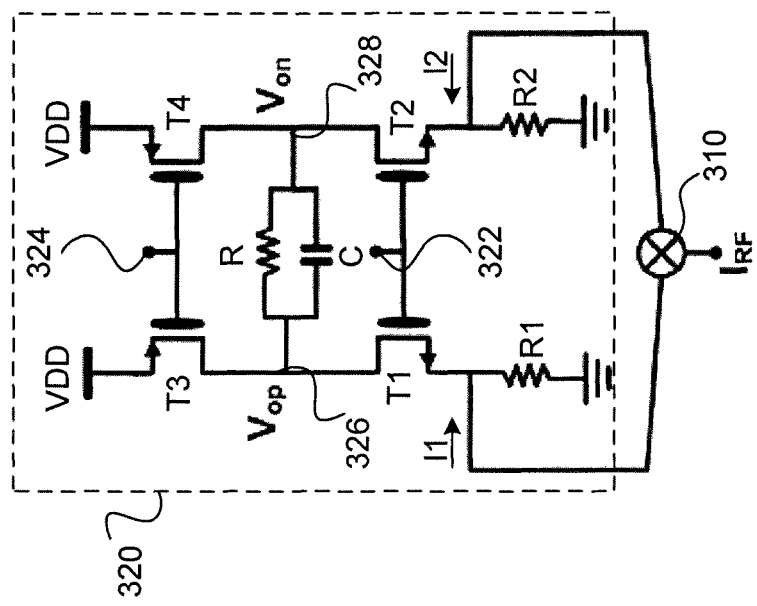
FIG. 3B
FIG. 3A

RECEIVER ARCHITECTURE WITH COMPLEMENTARY PASSIVE MIXER AND COMPLEMENTARY COMMON-GATE TIA WITH LOW-NOISE GAIN CONTROL

TECHNICAL FIELD

The present description relates generally to radio frequency (RF) communications, and more particularly, but not exclusively, to a receiver architecture with complementary passive mixer and complementary common-gate TIA with low-noise gain control.

BACKGROUND

As the number of wireless standards and the range of frequencies of wireless communications continue to increase, there is an increasing need for communication receivers that are capable of handling multiple wireless standards spanning a wide range of frequencies. Also, as the number of wireless devices and the amount of wireless communications taking place increase, the communication receivers may have to be able to function satisfactorily in the presence of large amounts of noise and interference.

Further, the multitude of battery operated wireless devices has created a demand for extremely low-power transceivers to increase the handset talk time and to reduce the battery size and ultimately the cost. Meanwhile, the noise and linearity requirements are becoming more stringent to meet the quest for higher data rates with a highly congested spectrum. Typically, implementing low-noise receivers may become more challenging when the design objectives also include low-power consumption and larger blocker signal tolerance.

Therefore, the need exists for low-power and low-noise receivers that can tolerate larger blocker signals.

BRIEF DESCRIPTION OF THE DRAWINGS

Certain features of the subject technology are set forth in the appended claims. However, for purpose of explanation, several embodiments of the subject technology are set forth in the following figures.

FIG. 2A illustrates an example of a receiver architecture using a passive mixer and a complementary common-gate trans-impedance amplifier (TIA) in accordance with one or more implementations.

FIGS. 2B-2C illustrate examples of passive mixers for the receiver architecture of FIG. 2A in accordance with one or more implementations.

FIG. 3A illustrates an example of a common-gate TIA coupled to a passive mixer in accordance with one or more implementations.

FIG. 3B illustrates an example of a blocker-tolerant passive mixer coupled to a low-power complementary TIA in accordance with one or more implementations.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

Figure 1:
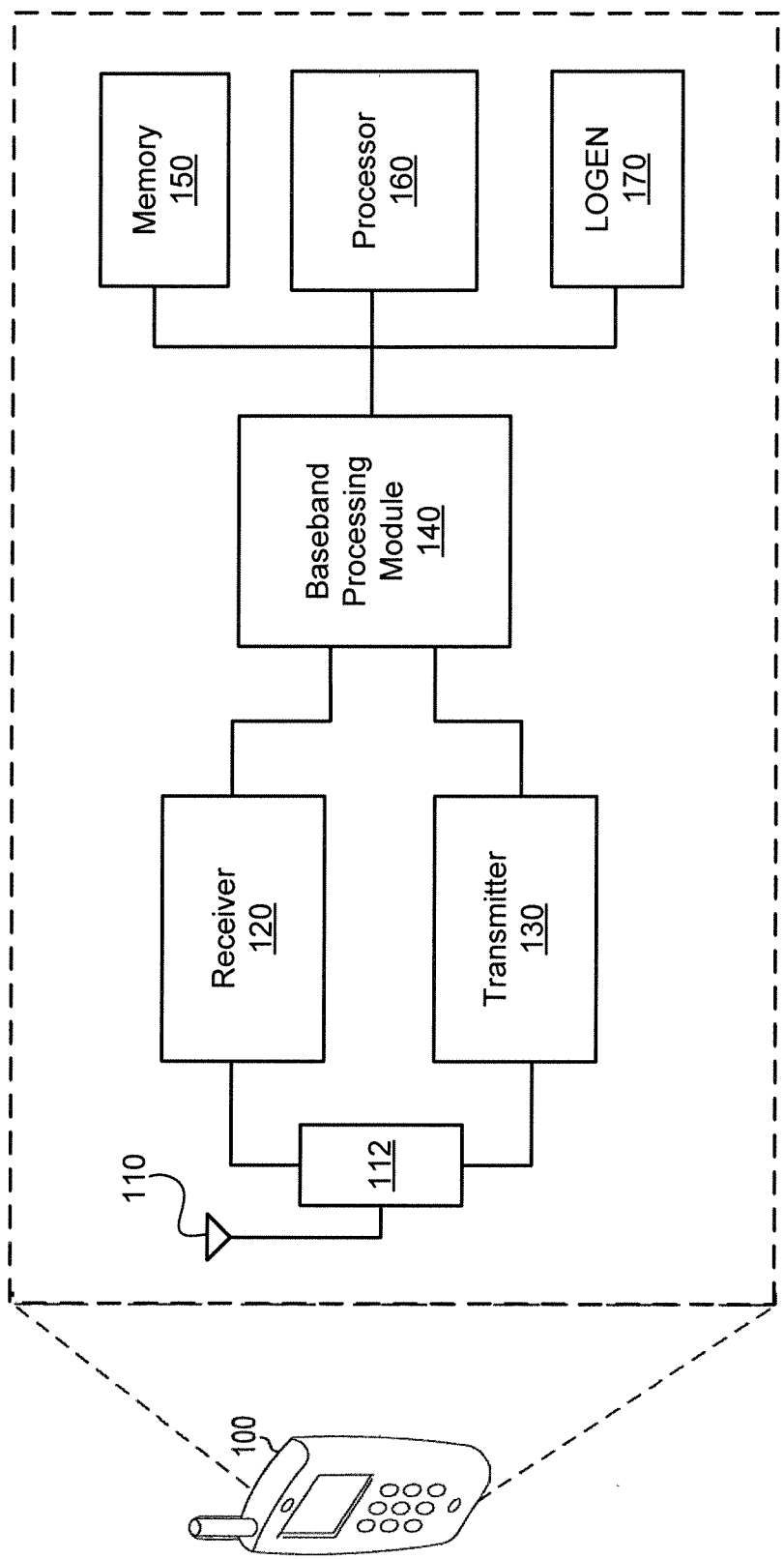
FIG. 1 illustrates an example wireless communication device in accordance with one or more implementations.

FIG. 1 illustrates an example wireless communication device 100 in accordance with one or more implementations of the subject technology. The wireless communication device 100 may comprise a radio-frequency (RF) antenna 110, a receiver 120, a transmitter 130, a baseband processing module 140, a memory 150, a processor 160, and a local oscillator generator (LOGEN) 170. In various embodiments of the subject technology, one or more of the blocks represented in FIG. 1 may be integrated on one or more semiconductor substrates. For example, the blocks 120-170 may be realized in a single chip or a single system on chip, or may be realized in a multi-chip chipset.

The RF antenna 110 may be suitable for transmitting and/or receiving RF signals (e.g., wireless signals) over a wide range of frequencies. Although a single RF antenna 110 is illustrated, the subject technology is not so limited. The receiver 120 may comprise suitable logic circuitry and/or code that may be operable to receive and process signals from the RF antenna 110. The receiver 120 may, for example, be operable to amplify and/or down-convert received wireless signals. In various embodiments of the subject technology, the receiver 120 may be operable to cancel noise in received signals and may be linear over a wide range of frequencies. In this manner, the receiver 120 may be suitable for receiving signals in accordance with a variety of wireless standards. Wi-Fi, WiMAX, Bluetooth, and various cellular standards. In various embodiments of the subject technology, the receiver 120 may not require any SAW filters and few or no off-chip discrete components such as large capacitors and inductors.

The transmitter 130 may comprise suitable logic circuitry and/or code that may be operable to process and transmit signals from the RF antenna 110. The transmitter 130 may, for example, be operable to up-convert baseband signals to RF signals and amplify RF signals. In various embodiments of the subject technology, the transmitter 130 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 130 may be operable to provide signals for further amplification by one or more power amplifiers.

The duplexer 112 may provide isolation in the transmit band to avoid saturation of the receiver 120 or damaging parts of the receiver 120, and to relax one or more design requirements of the receiver 120. Furthermore, the duplexer 112 may attenuate the noise in the receive band. The duplexer may be operable in multiple frequency bands of various wireless standards.

The baseband processing module 140 may comprise suitable logic, circuitry, interfaces, and/or code that may be operable to perform processing of baseband signals. The baseband processing module 140 may, for example, analyze received signals and generate control and/or feedback signals for configuring various components of the wireless communication device 100 such as the receiver 120. The baseband processing module 140 may be operable to encode, decode, transcode, modulate, demodulate, encrypt, decrypt, scramble, descramble, and/or otherwise process data in accordance with one or more wireless standards.

The processor 160 may comprise suitable logic, circuitry, and/or code that may enable processing data and/or controlling operations of the wireless communication device 100. In this regard, the processor 160 may be enabled to provide control signals to various other portions of the wireless communication device 100. The processor 160 may also control transfers of data between various portions of the wireless communication device 100. Additionally, the processor 160 may enable implementation of an operating system or otherwise execute code to manage operations of the wireless communication device 100.

The memory 150 may comprise suitable logic, circuitry, and/or code that may enable storage of various types of information such as received data, generated data, code, and/or configuration information. The memory 150 may comprise, for example, RAM, ROM, flash, and/or magnetic storage. In various embodiment of the subject technology, Information stored in the memory 150 may be utilized for configuring the receiver 120 and/or the baseband processing module 140.

The local oscillator generator (LOG EN) 170 may comprise suitable logic, circuitry, interfaces, and/or code that may be operable to generate one or more oscillating signals of one or more frequencies. The LOGEN 170 may be operable to generate digital and/or analog signals. In this manner, the LOGEN 170 may be operable to generate one or more clock signals and/or sinusoidal signals. Characteristics of the oscillating signals such as the frequency and duty cycle may be determined based on one or more control signals from, for example, the processor 160 and/or the baseband processing module 140.

In operation, the processor 160 may configure the various components of the wireless communication device 100 based on a wireless standard according to which it is desired to receive signals. Wireless signals may be received via the RF antenna 110 and amplified and down-converted by the receiver 120. The baseband processing module 140 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 150, and/or information affecting and/or enabling operation of the wireless communication device 100. The baseband processing module 140 may modulate, encode and perform other processing on audio, video, and/or control signals to be transmitted by the transmitter 130 in accordance to various wireless standards.

FIG. 2A illustrates an example of a receiver architecture 200A using passive mixer 240 and a complementary common-gate trans-impedance amplifier (TIA) 250 in accordance with one or more implementations of the present subject technology. The receiver architecture 200A include a front-end module 220, a low-noise amplifier (LNA) 230, a mixer-TIA block 270, and an analog-to-digital converter (ADC) 260. The mixer-TIA block 270 may include a passive mixer 240 and a TIA 250 with an parallel RC circuit in its feedback loop. The front-end module 220 may comprise suitable circuits to receive radio-frequency (RF) signals from an antenna 210 and to process (e.g., filter) the RF signals in accordance with one or more standards (e.g., wireless standards). In one or more implementations, the front-end module 220 may be operable to cancel noise in the received RF signals and may be linear over a wide range of frequencies. The LNA 230 may include a trans-conductance LNA, and may provide an initial gain (e.g., 15 dB) with a low noise figure (NF) for the RF signal received from the front-end module 220.

The mixer 240 may down convert the RF signal to a baseband signal (e.g., in a direct conversion receiver architecture) or to an intermediate frequency (IF) signal (e.g., in a heterodyne receiver), which is further amplified and filtered by the TIA 250 and possible filter stages (not shown for simplicity) following the TIA 250, before reaching the ADC 260. For the direct converson receiver, the ADC 260 may convert the analog baseband signal to digital baseband signal which is further processed digitally in a baseband section (not shown). In the present disclosure, the mixer-TIA block 270 is further discussed and a blocker-tolerant passive mixer coupled to a low power complementary TIA is described.

FIGS. 2B-2C illustrate examples of passive mixers 200B and 200C for the receiver architecture 200A of FIG. 2A in accordance with one or more implementations of the present subject technology. The passive mixer 200B includes a transmission-gate structure formed by a pair of NMOS transistors T1 and T2. Differential local oscillator (LO) signals (e.g., $LO_p$ and $LO_n$) are received at gate nodes of the transistors T1 and T2, and the RF signal is coupled to the source nodes of the transistors T1 and T2. The output IF signals are provided at drain nodes of the transistors T1 and T2. One disadvantage of the mixer 200B is that a large blocker signal at the source nodes of the NMOS transistors may turn these transistors OFF, and thus prevent normal operation of the mixer. One solution for this problem is to use complementary transmission-gate passive mixers as shown in FIG. 2C, which include both NMOS and PMOS transistors.

The use of NMOS transistors was preferred in the 40 nm and older technologies, due to higher speed of NMOS devices, which was made possible by higher mobility of electrons as compared with holes. For the 28 nm and newer technologies, due to material improvements, the advantages of NMOS devices over PMOS devices may not be significant any longer, and the use of PMOS devises to leverage their benefits may be equally plausible. The passive mixer 200C is a complementary transmission-gate passive mixer, in which NMOS transistors Ti and T2 are coupled in parallel with PMOS transistors T3 and T4. The complementary transmission-gate passive mixer 200C has the advantage of tolerance for substantially larger blocker signals. This is because when the NMOS transistors T1 and T2 are turned OFF by large positive blocker signals, PMOS transistors T3 and T4 are operational and can take over and vice versa for the case of large negative blocker signals. The complementary transmission-gate passive mixer 200C may be viewed as two equally functional NMOS and PMOS halves that each can be suitably coupled to a portion of a next stage (e.g., a TIA). The NMOS portion may include NMOS transistors T1 and T2 and the PMOS portion may include PMOS transistors T3 and T4.

FIG. 3A illustrates an example of a common-gate TIA 320 coupled to a passive mixer 310 in accordance with one or more implementations of the present subject technology. The passive mixer 310 may include a transmission-gate passive mixer, such as the transmission-gate passive mixers 200B and 200C of FIGS. 2B and 2C. The common-gate TIA 320 is formed by the NMOS transistors T1 and T2, the drain node of which are coupled to an active load. The common-gate TIA 320 receives IF current signals I1 and I2 from the mixer 310 at the source nodes of the NMOS transistors T1 and T2, and provides differential output voltage signals $V_{op}$ and $V_{on}$ at output nodes 326 and 328. The source nodes of the NMOS transistors T1 and T2 are coupled through resistors R1 and R2, respectively, to ground potential.

The active load may include PMOS transistors T3 and T4, the drain nodes of which are coupled to drain nodes of the NMOS transistors T1 and T2. The source nodes of the PMOS transistors T3 and T4 are coupled to a supply voltage $V_{DD}$ (e.g., 1.5V). The gate nodes of the PMOS transistors T3 and T4 and the NMOS transistors T1 and T2 are, respectively, coupled at nodes 324 and 322 to suitable bias circuits (not shown for simplicity). An RC load including a parallel connected resistor R and capacitor C may be coupled between the nodes 326 and 328. The common-gate TIA 320 can be tolerant to larger blocker signals if coupled to the complementary transmission-gate mixer 200C.

FIG. 3B illustrates an example of a blocker-tolerant passive mixer 330 coupled to a low-power complementary TIA 340 in accordance with one or more implementations of the present subject technology. The passive mixers 330 may include a first portion 330-N and a second portion 330-P, which may, include the respective NMOS portion and PMOS portion of a complementary transmission-gate passive mixer, such as the complementary transmission-gate passive mixers 200C of FIGS. 2C. For example, the first portion 330-N may include NMOS transistors T1 and T2 of FIGS. 2C, and the second portion 330-P may include PMOS transistors T3 and T4 of FIGS. 2C. The complementary common-gate TIA 340 is formed by two parallel common-gate stages including an NMOS common-gate stage and PMOS common-gate stage. The NMOS common-gate stage includes NMOS transistors T1 and T2 and the PMOS common-gate stage includes PMOS transistors T3 and T4. The drain node of NMOS transistors T1 and T2 are coupled to drain nodes of the PMOS transistors T3 and T4. The complementary common-gate TIA 340 may receive IF current signals I1 and I2 from the first portion 330-N of the mixer 330 at the source nodes of the NMOS transistors T1 and T2, and IF current signals I3 and I4 from the second portion 330-P of the mixer 330 at the source nodes of the PMOS transistors T3 and T4. In response to receiving the IF current signals, the complementary common-gate TIA 340 may provide differential output voltage signals $V_{op}$ and $V_{on}$ at output nodes 346 and 348. It is worth noting that the IF current signals I1 and I2 may include a first portion of the IF currents $I_{Fp}$ and $I_{Fn}$ of FIG. 2C and the IF current signals I3 and I4 may include a second portion of the IF currents $I_{Fp}$ and $I_{Fn}$ of FIG. 2C.

The source nodes of the NMOS transistors T1 and T2 are coupled through resistors R1 and R2, respectively, to ground potential, and The source nodes of the PMOS transistors T3 and T4 are coupled through resistors R3 and R4, respectively, to a supply voltage $V_{DD}$ (e.g., 1.5V). The gate nodes of the PMOS transistors T3 and T4 and the NMOS transistors T1 and T2 are, respectively, coupled at nodes 344 and 342 to suitable bias circuits (not shown for simplicity). An RC load including a parallel connected resistor R and capacitor C may be coupled between the output nodes 346 and 348.

One of the advantages of the complementary common-gate TIA 340 is that it is coupled to the complementary transmission-gate mixer 330, which has the benefit of being tolerant to larger blocker signals (e.g., with amplitudes up to $V_{DD}$). Furthermore, the complementary common-gate TIA 340 benefits from gains of both the NMOS and PMOS common-gate stages (e.g., approximately twice the gain of an NMOS common-gate stage), therefore can consume approximately 50% less power for the same performance (e.g., the same gain as of an NMOS common-gate stage). The complementary common-gate TIA 340 may be advantageously coupled to an RC load including a variable resistor network that can provide a low-noise gain control.

Figure 4:
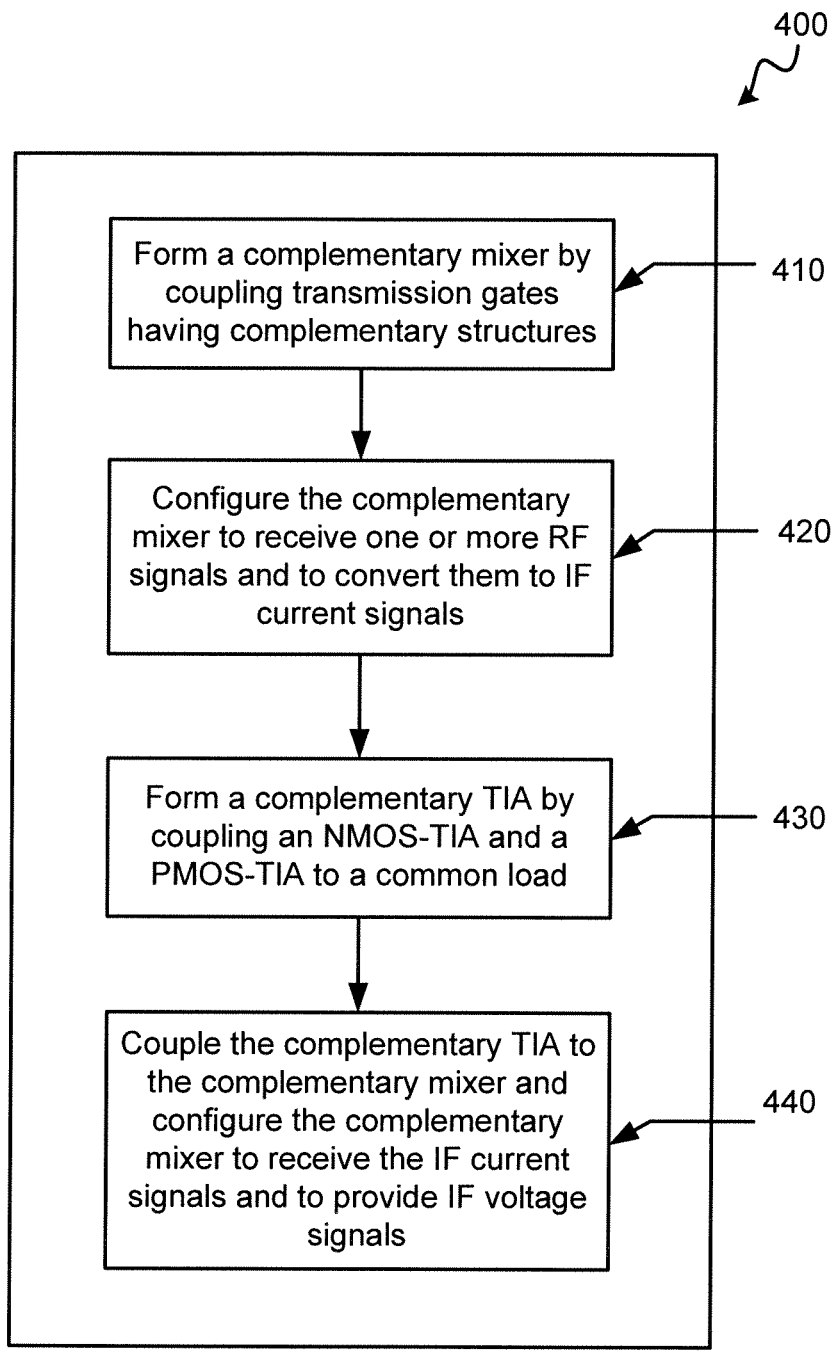
FIG. 4 illustrates an example method for providing a low-power and blocker-tolerant mixer-amplifier in accordance with one or more implementations.

FIG. 4 illustrates an example method for providing a low-power and blocker-tolerant mixer-amplifier in accordance with one or more implementations of the present subject technology. For explanatory purposes, the example method 400 is described herein with reference to the blocker-tolerant passive mixer 200C of FIG. 2C and the low-power complementary TIA 340 of FIG. 3B; however, the example method 400 is not limited to the passive mixer 200C, and complementary TIA 340. Further for explanatory purposes, the blocks of the example method 400 are described herein as occurring in serial, or linearly. However, multiple blocks of the example method 400 may occur in parallel. In addition, the blocks of the example method 400 need not be performed in the order shown and/or one or more of the blocks of the example method 400 need not be performed.

At operation block 410, a complementary mixer (e.g., 200C of FIG. 2C and 330 of FIG. 3B) may be formed by coupling transmission gates having complementary structures (e.g., transmission gates formed by transistor pairs T1-T3 and T2-T4 of FIG. 2C). At operation block 420, the complementary mixer may be configured to receive one or more radio-frequency (RF) signals (e.g., $I_{RF}$ of FIG. 2C) and to convert the one or more RF signals to intermediate frequency (IF) current signals (e.g., $I_{IFp}$ and $I_{IFn}$ of FIG. 2C). A complementary TIA (e.g., 340 of FIG. 3B) may be formed, at operation block 430, by coupling an NMOS-TIA (e.g., common-gate TIA formed by NMOS transistors T1 and T2 of FIG. 3B) and a PMOS-TIA (e.g., common-gate TIA formed by PMOS transistors T3 and T4 of FIG. 3B) to a common load (e.g., RC load of FIG. 3B). At operation block 440, the complementary TIA may be coupled to the complementary mixer and the complementary mixer may be configured to receive the IF current signals (e.g., I1, I2, I3, and I4 of FIG. 3B) and to provide IF voltage signals (e.g., $V_{op}$ and $V_{on}$ of FIG. 3B). Coupling the complementary TIA to the complementary mixer may include coupling a first portion (e.g., 330-N of FIG. 3B) of the complementary mixer to the NMOS-TIA and a second portion (e.g., 330-P of FIG. 3B) of the complementary mixer to the PMOS-TIA.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit for a low-power and blocker-tolerant mixer-amplifier stage, the circuit comprising:
   a complementary mixer formed by transmission gates having complementary structures, the complementary mixer being configured to receive one or more radio-frequency (RF) signals and to convert the one or more RF signals to intermediate frequency (IF) current signals; and
   a complementary TIA coupled to the complementary mixer and configured to receive the IF current signals and to provide IF voltage signals, the complementary TIA being formed by coupling an NMOS-TIA and a PMOS-TIA to a common load,
   wherein a first portion of the complementary mixer is coupled to the NMOS-TIA and a second portion of the complementary mixer is coupled to the PMOS-TIA.

2. The circuit of claim 1, wherein the NMOS-TIA comprises a common-gate NMOS-TIA, and wherein the PMOS-TIA comprises a common-gate PMOS-TIA.

3. The circuit of claim 1, wherein the NMOS-TIA comprises a differential common-gate NMOS-TIA, and wherein the PMOS-TIA comprises a differential common-gate PMOS-TIA.

4. The circuit of claim 3, wherein the complementary TIA is formed by coupling drain nodes of a corresponding NMOS transistor pair of the differential common-gate NMOS-TIA to drain nodes of a corresponding PMOS transistor pair of the differential common-gate PMOS-TIA.

5. The circuit of claim 3, wherein output nodes of the first portion of the complementary mixer are coupled to source nodes of a corresponding NMOS transistor pair of the differential common-gate NMOS-TIA, and wherein output nodes of the second portion of the complementary mixer are coupled to source nodes of a corresponding PMOS transistor pair of the differential common-gate PMOS-TIA.

6. The circuit of claim 3, wherein the common load comprises an RC load, and wherein the common load is coupled between drain nodes of a corresponding NMOS transistor pair of the differential common-gate NMOS-TIA and drain nodes of a corresponding PMOS transistor pair of the differential common-gate PMOS-TIA.

7. The circuit of claim 1, wherein the first portion of the complementary mixer comprises an NMOS transmission gate and the second portion of the complementary mixer comprises a PMOS transmission gate.

8. The circuit of claim 1, wherein the common load comprises a variable RC load and is configured to provide a low-noise gain control for the complementary TIA, and wherein the complementary mixer is configured to tolerate large blocker signals.

9. The circuit of claim 1, wherein the complementary TIA is configured to consume lower power as compared to a non-complementary TIA with similar amplification.

10. A method for providing a low-power and blocker-tolerant mixer-amplifier, the method comprising:
    forming a complementary mixer by coupling transmission gates having complementary structures, and configuring the complementary mixer to receive one or more radio-frequency (RF) signals and to convert the one or more RF signals to intermediate frequency (IF) current signals;
    forming a complementary TIA by coupling an NMOS-TIA and a PMOS-TIA to a common load; and
    coupling the complementary TIA to the complementary mixer and configuring the complementary TIA to receive the IF current signals and to provide IF voltage signals,
    wherein coupling the complementary TIA to the complementary mixer comprises coupling a first portion of the complementary mixer to the NMOS-TIA and a second portion of the complementary mixer to the PMOS-TIA.

11. The method of claim 10, wherein coupling the NMOS-TIA comprises coupling a common-gate NMOS-TIA, and wherein coupling the PMOS-TIA comprises coupling a common-gate PMOS-TIA.

12. The method of claim 10, wherein coupling the NMOS-TIA comprises coupling a differential common-gate NMOS-TIA, and wherein coupling the PMOS-TIA comprises coupling a differential common-gate PMOS-TIA.

13. The method of claim 12, wherein forming the complementary TIA comprises coupling drain nodes of a corresponding NMOS transistor pair of the differential common-gate NMOS-TIA to drain nodes of a corresponding PMOS transistor pair of the differential common-gate PMOS-TIA.

14. The method of claim 12, further comprising coupling output nodes of the first portion of the complementary mixer to the source nodes of a corresponding NMOS transistor pair of the differential common-gate NMOS-TIA, and coupling output nodes of the second portion of the complementary mixer to the source nodes of a corresponding PMOS transistor pair of the differential common-gate PMOS-TIA.

15. The method of claim 10, wherein the first portion of the complementary mixer comprises an NMOS transmission gate, and wherein the second portion of the complementary mixer comprises a PMOS transmission gate.

16. The method of claim 12, wherein the common load comprises an RC load, and wherein the method comprises coupling the common load between drain nodes of the corresponding NMOS transistor pair of the differential common-gate NMOS-TIA and drain nodes of a corresponding PMOS transistor pair of the differential common-gate PMOS-TIA.

17. The method of claim 10, wherein the common load comprises a variable RC load, and wherein the method comprises configuring the variable RC load to provide a low-noise gain control for the complementary TIA, and configuring the complementary mixer to tolerate large blocker signals.

18. The method of claim 10, further comprising configuring the complementary TIA to consume lower power as compared to a non-complementary TIA with similar amplification.

19. A circuit for a radio-frequency (RF) receiver, the circuit comprising:
a front-end circuit configured to receive RF signals from an RF antenna;
a complementary mixer formed by transmission gates having complementary structures, the complementary mixer being configured to receive one or more RF signals from the front-end circuit and to convert the one or more RF signals to intermediate frequency (IF) current signals; and
a complementary TIA coupled to the complementary mixer and configured to receive the IF current signals and to provide IF voltage signals, the complementary TIA being formed by coupling an NMOS-TIA and a PMOS-TIA to a common load,
wherein a first portion of the complementary mixer is coupled to the NMOS-TIA and a second portion of the complementary mixer is coupled to the PMOS-TIA.

20. The circuit of claim 19, wherein:
the NMOS-TIA comprises a differential common-gate NMOS-TIA and the PMOS-TIA comprises a differential common-gate PMOS-TIA,
the complementary TIA is formed by coupling drain nodes of a corresponding NMOS transistor pair of the differential common-gate NMOS-TIA to drain nodes of a corresponding PMOS transistor pair of the differential common-gate PMOS-TIA,
output nodes of the first portion of the complementary mixer are coupled to source nodes of the corresponding NMOS transistor pair of the differential common-gate NMOS-TIA, and output nodes of the second portion of the complementary mixer are coupled to source nodes of the corresponding PMOS transistor pair of the differential common-gate PMOS-TIA, and
the first portion of the complementary mixer comprises an NMOS transmission gate and the second portion of the complementary mixer comprises a PMOS transmission gate.

* * * * *